United States Patent [19]

Liang

[11] Patent Number: 5,387,554
[45] Date of Patent: Feb. 7, 1995

[54] APPARATUS AND METHOD FOR THERMALLY COUPLING A HEAT SINK TO A LEAD FRAME

[75] Inventor: Louis H. Liang, Los Altos, Calif.

[73] Assignee: VLSI Technology, Inc., San Jose, Calif.

[21] Appl. No.: 97,243

[22] Filed: Jul. 23, 1993

Related U.S. Application Data

[62] Division of Ser. No. 943,272, Sep. 10, 1992, abandoned.

[51] Int. Cl.⁶ ............................................. H01L 21/60
[52] U.S. Cl. .................................. 437/209; 437/214; 437/217; 437/219; 437/220
[58] Field of Search ............... 437/209, 217, 215, 214, 437/220; 257/707, 706, 709, 712

[56] References Cited

U.S. PATENT DOCUMENTS

| | | | |
|---|---|---|---|
| 3,611,046 | 10/1971 | Covert | 317/100 |
| 3,930,114 | 12/1975 | Hodge | 174/52 |
| 4,092,697 | 5/1978 | Spaight | 361/386 |
| 5,091,341 | 2/1992 | Asada et al. | 437/212 |
| 5,162,975 | 11/1992 | Matta et al. | 257/712 |
| 5,200,809 | 4/1993 | Kwon | 257/707 |
| 5,218,215 | 6/1993 | Liang et al. | 257/712 |

*Primary Examiner*—Brian E. Hearn
*Assistant Examiner*—Kevin M. Picardat
*Attorney, Agent, or Firm*—Patrick T. King

[57] ABSTRACT

A molded plastic package for an integrated-circuit die includes a lead frame having a central die-attach paddle. One side of the die-attach paddle has an integrated-circuit die fixed thereto. A heat sink member is resiliently fixed to the other side of the die-attach paddle using a layer of viscous thermal grease between the heat sink member and the other side of the die-attach paddle. One or more holes are formed in the lead frame and are engaged by corresponding studs on the heat sink. The stud has a shoulder portion which engages the lead frame to prevent the stud from further passing through the hole in the lead frame.

5 Claims, 3 Drawing Sheets

APPARATUS AND METHOD FOR THERMALLY COUPLING A HEAT SINK TO A LEAD FRAME

This is a division of application Ser. No. 07/943,272, filed Sep. 10, 1992 now abandoned.

BACKGROUND OF THE INVENTION

1. Field of the Invention

This invention relates to packaging techniques for integrated circuits and, more particularly, to molded plastic packages in which a heat sink is included.

2. Prior Art

A heat sink is attached directly to a die-attach paddle of a lead frame using one of a number of conventional attachment techniques, including welding, soldering, brazing, and adhesive-bonding.

An example of an integrated-circuit package which uses a heat sink is shown in a U.S. Pat. No. 3,930,114, invented by R. Hodge and granted Dec. 30, 1975. The Hodge patent shows an integrated-circuit chip fixedly secured to the upper surface of a die-attachment pad. An elongated copper heat sink is brazed to the under side of the die-attachment pad. The Hodge patent provides a pair of L-shaped flexible fingers which forces the heat sink against the lower surface of a mold so that the lower, exposed surface of the heat sink is pressed against the surface of the mold and no molten plastic can penetrate onto the normally exposed surface of the heat sink. This eliminates the need to grind away hardened encapsulent material to expose the surface of the copper heat sink.

Using conventional attachment techniques to rigidly attach a heat sink to a lead frame for an integrated circuit may raise several problems, particularly if dissimilar materials are used. One of these problems is the dissimilarity in the temperature coefficients of expansion (TCE) for the different materials used in the lead frame, the heat sink, and sometimes the attachment material. These differences in the temperature coefficients of expansion are important because of the possible reliability problems caused when stresses are built up in a package assembly at various temperature due to the differences in the TCE's. Restrictions on selection of material to avoid dissimilarities in TCE's may preclude using the best materials possible for particular functions. For example, copper or a copper alloy is a good material for a lead frame and aluminum or an aluminum alloy is a good material for a heat sink. The TCE's (in units of $10^{-7}$/degree Centigrade) for various materials are: copper: 170; Cu/W alloy: 70; Cu/Mo: 72; and aluminum: 230.

Another problem is the extra cost incurred in using special tooling and special materials for a package with a heat sink, as compared to the standard cost incurred in using a standard package without heat sinks. For example, a package mold designed for use with an aluminum alloy leadframe cannot be used with copper lead frames. High tensile strength copper is typically more expensive than A142 aluminum alloy or aluminum.

Another cost item is that heat sinks must be prefabricated and attached to the lead frame at the lead frame manufacturing site. This increases the need for additional inventories of lead frames with heat sinks and lead frames without heat sinks at an assembly sites to accommodate needs for both types of lead frames. This also requires that additional raw materials be stocked at a lead frame manufacturing sites.

Various types of drop-in or floating heatsink designs have addressed the problems associated with the inventory problems and problems associated with dissimilarities in the temperature coefficients of expansion (TCE) for the different materials. These drop-in heatsinks sometimes fail to provide positive thermal coupling between a lead frame and a heatsink. Too large of a gap between the drop-in heatsink and the lead frame allows molding compound to fill the space between the lead frame and the heatsink. Because the molding compound is a thermal insulator, the thermal efficiency of the package can be affected. Too small of a gap between the drop-in heatsink and the lead frame can create a trapped air space. The trapped air space is also a thermal insulator and can be a source of unreliability because moisture tends to gather in the trapped air pocket. An additional concern with a drop-in or floating heatsink design is called pad tilting. Molding compound injected into a mold cavity at a high velocity can differentially fill the gap between the heatsink and the lead frame. This creates pad tilt which creates a reliability problem for plastic quad packages with high pin counts.

The need has arisen for an economical integrated-circuit packaging technique which provides a standardized lead frame which can be mechanically isolated from an optionally used heat sink.

SUMMARY OF THE INVENTION

It is therefore an object of the invention to provide apparatus and a method for thermally coupling a lead frame for an integrated-circuit die to a heat sink, at the option of a user. Another object of the invention is to provide a flexible system which optionally provides for attachment of a heat sink to a metric quad flat pack (MQFP) package configuration such that the heat sink can be optionally added at the package assembly stage and such that mismatch of the TCE's of the lead frame and the heat sink are not critical.

In accordance with this and other objects of the invention, a molded plastic package assembly is provided according to the invention. A lead frame has a central die-attach paddle, one side of which is adapted to having an integrated-circuit die fixed thereto. A heat sink member positioned adjacent to the other side of the die-attach paddle and resiliently fixed the heat sink member to the other side of the die-attach paddle. A layer of viscous thermal grease is located between the heat sink member and the other side of the die-attach paddle to resiliently fix the heat sink member to the other side of the die-attach paddle.

Coarse positioning means are provided for coarsely positioning the heat sink with respect to the other side of the die-attach paddle including one or more studs fixed to the heat sink, where the studs engage respective holes formed in the lead frame. The holes are formed in the central die-attach paddle portion of the lead frame or in the tie bar portion of the lead frame so that the leadframe can be clipped to the studs. The distal end of the stud is larger than the intermediate portion of the stud so that the intermediate portion of a stud is engaged with a corresponding hole in the lead frame. Spacing means are provide for spacing the heat sink member a predetermined distance away from the other side of the die-attach paddle where the spacing means includes a stud having a shoulder portion which engages the lead frame to prevent the stud from further passing through the hole in the lead frame.

The method for cooling an integrated-circuit die includes attaching a lead frame to one side of a central die-attach paddle portion of a lead frame. A heat sink member is resiliently fixed to the other side of the die-attach paddle with a layer of viscous thermal grease between the heat sink member and the other side of the die-attach paddle.

The method includes the step of coarsely positioning the heat sink with respect to the other side of the die-attach paddle using one or more studs fixed to the heat sink where the one or more studs engage respective holes which are formed in the lead frame. The holes formed in the lead frame engage one or more holes formed in the central die-attach paddle portion of the lead frame or in the tie bar portion of the lead frame. The heat sink member is spaced a predetermined distance away from the other side of the die-attach paddle using a shoulder portion of the stud to engage the lead frame and prevent the stud from further passing through the hole in the lead frame.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
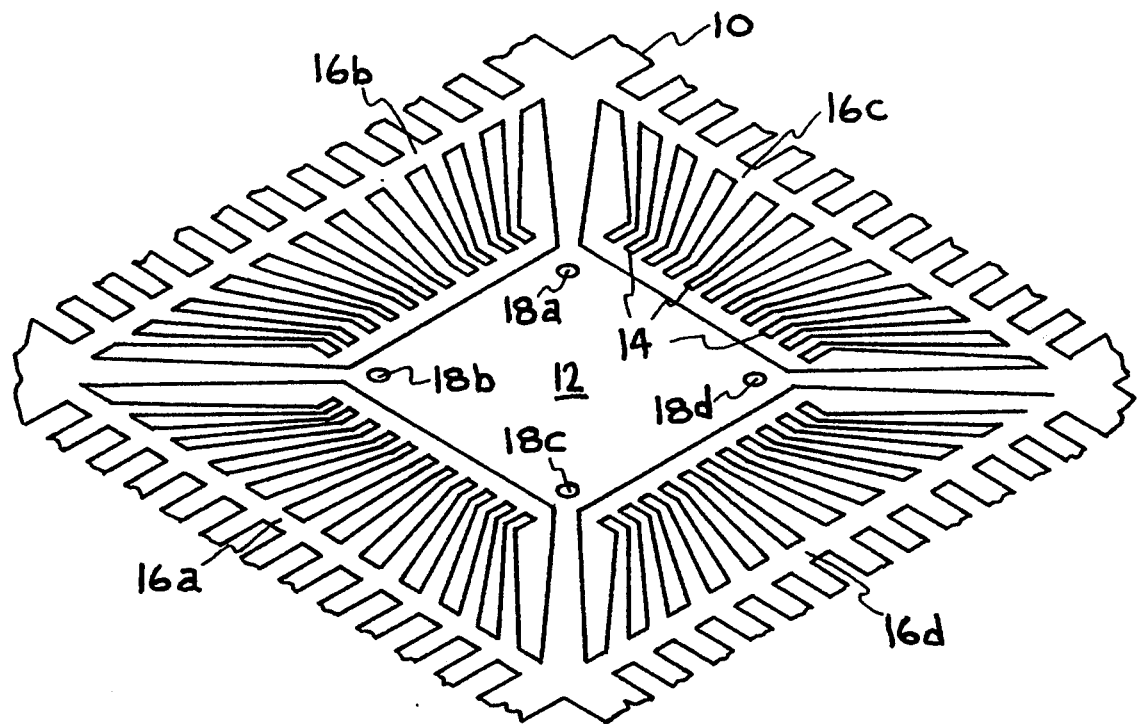
FIG. 1 is an isometric view of a lead frame prior to assembly and trim operations, where the lead frame includes locating holes formed at the corners of the die-attach paddle for receiving locating studs of a floating heat sink member.

FIG. 1 illustrates a lead frame 10, used according to the invention, prior to assembly and trim operations. The lead frame 10 is formed from a thin strip of alloy 42 material. A centrally-located die-attach paddle 12 is provided for attachment of an integrated-circuit die. (not shown in the Figure) to the top side thereof. A number of radially-extending leads (typically shown as 14) are mechanically attached together by sections 16a-16b of a dambar, which are removed after the lead frame and the attached integrated-circuit die are encapsulated in a molded package. The leads have bonding fingers located adjacent to the edges of the die-attach paddle. Bonding wires are connected between bonding pads formed on the integrated-circuit die and the bonding fingers on the ends of the leads prior to encapsulation. Locating holes 18a-18d are formed through the corners of the die-attach paddle for receiving locating studs of a floating heat sink member.

Figure 2:
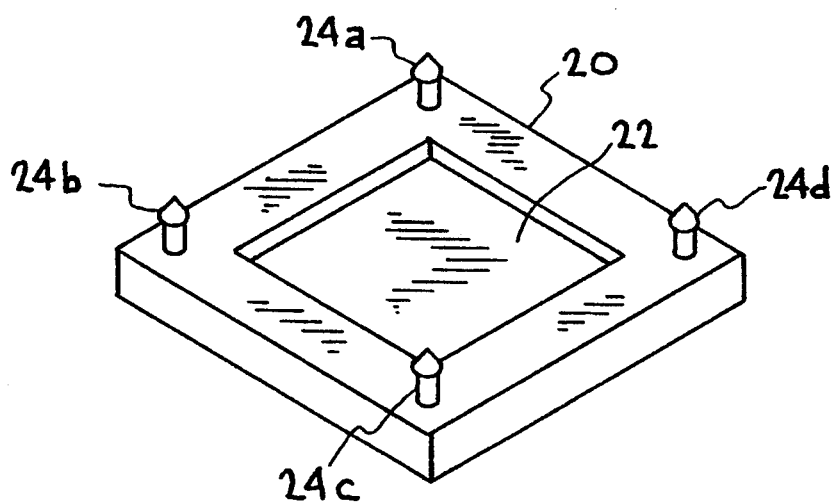
FIG. 2 is an isometric view of a heat sink having locating studs formed at each corner and having a central recessed area formed therein for containing a viscous thermal grease for attaching the heat sink to one side of the die-attach paddle.

FIG. 2 illustrates a floating heat sink member 20 which is formed of a conductive material such as copper. The floating heat sink member 20 is shaped as a rectangular plate having a shallow, centrally-located recessed area 22 formed into one side, as illustrated in the Figure. The cavity 22 is intended to contain a viscous thermal grease which is used for resiliently fixing the heat sink 20 to the back side of the die-attach paddle 12. Extending upwardly from each corner of the heat sink member are locating studs 24a-24d fixed into holes located at each corner of the heat sink 20. The studs fixed to the heat sink serve as means for coarsely positioning the heat sink with respect to the back side of the die-attach paddle 12.

Figure 3:
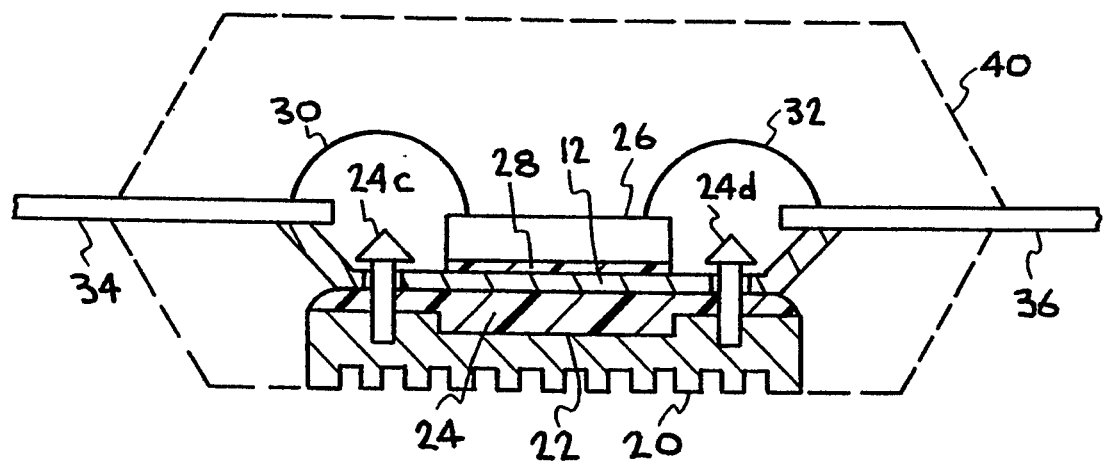
FIG. 3 is a sectional, elevation view of a package assembly showing a heat sink located adjacent to the backside of a die-attach paddle using a viscous thermal grease.

FIG. 3 shows the heat sink 20 fixed in position adjacent to the back side of the die-attach paddle 12 using a layer 24 of a highly viscous thermal grease. The layer 24 serves as a means for resiliently fixing the heat sink member to the back side of the die-attach paddle. The material used for the viscous thermal grease is, for example, a diamond filled silicone material or a material which after curing remains flexible. The layer 24 of viscous thermal grease provides a thermal path for heat from the die to the head sink 20. Because the heat sink is not rigidly attached to the die-attach paddle 12, it can be thought of as mechanically floating with respect to the lead frame. In this manner the various stress forces produced by differences in the thermal coefficients of expansion for the various materials are absorbed by the viscous layer 24.

An integrated-circuit die 26 is shown fixed to the top side of the die-attach paddle 12 with a layer 28 of die-attach adhesive material. Bonding wires 30, 32 are shown typically connected between die-bonding pads on the integrated-circuit die 26 and the inner ends of the leads 34, 36 of the lead frame. Locating studs 24c, 24d are shown extending through holes at the corners of the die-attach paddle 12. The studs hold the heat sink 20 in position during fabrication process steps immediately prior to encapsulation and formation of a package body. The profile of the molded package body is indicated by the contour line 40. In situations where no heat sink is used, the same lead frame can be used and no studs are used to coarsely align the heat sink member with respect to the back side of the die-attach paddle.

Figure 4:
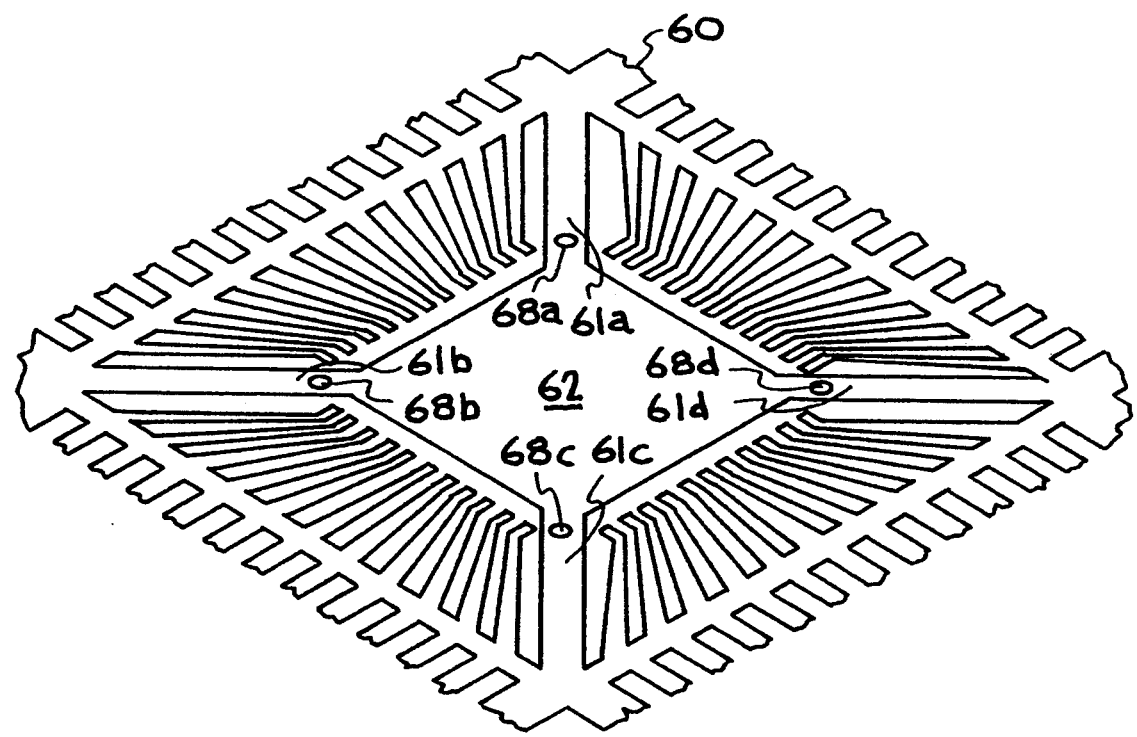
FIG. 4 shows a modified lead frame having somewhat enlarged tie-bars near the corners of the die-attach paddle so that the locating holes can be positioned in the tie bars.

FIG. 4 shows a modified lead frame 60 having enlarged 61a-61d tie-bars, particularly near the corners of a die-attach paddle 62. This allows the locating holes 68a-68d to be positioned in the tie bars and away from the central area of the die-attach paddle 62. This modified arrangement of the lead frame is provided so that the size of the die is not limited by interference with the locating pins located at the corners of a heat sink.

Figures 5A, 5B, 5C, 5D, 5E:
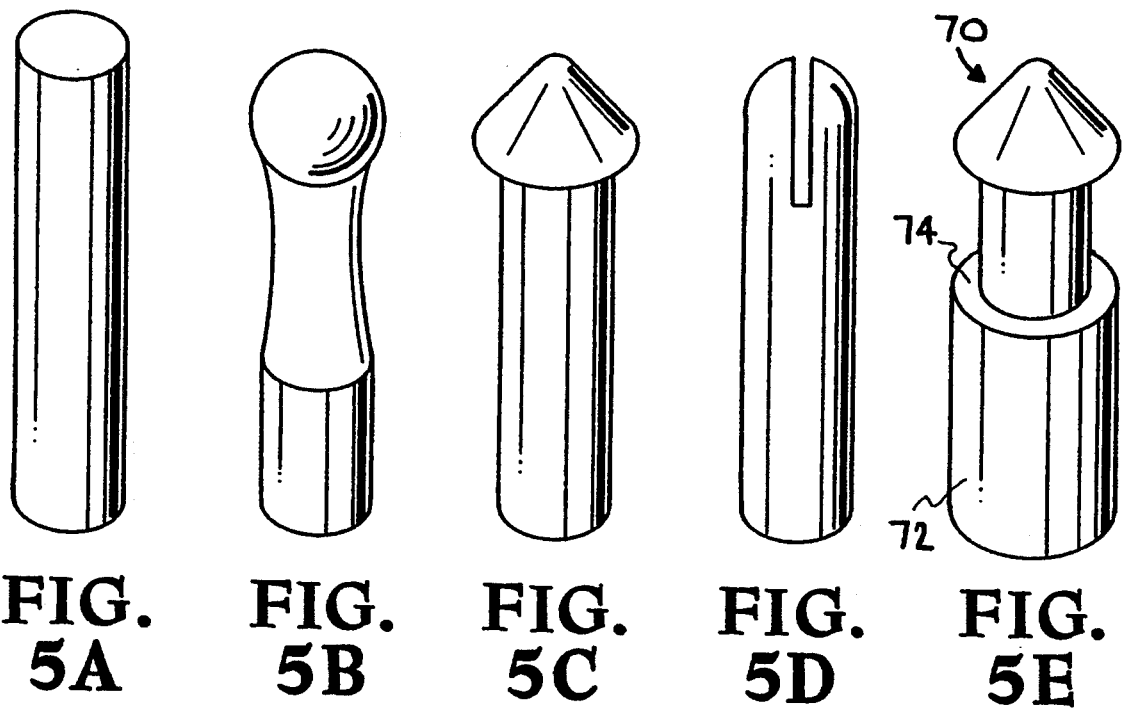
FIGS. 5A-5E are isometric views of various designs for locating studs.

FIGS. 5A–5E illustrate various locating studs designs. The distal ends of the studs shown in FIGS. 5B, 5C, and 5D are larger than their intermediate shank portions so that the intermediate portion of a stud is engaged within its corresponding hole in the die-attach paddle. Note that the stud of FIG. 5E has a base portion 72 which has a shoulder 74 with a diameter larger than the diameter of the locating holes formed in the corners of the die-attach paddle.

Figure 6:
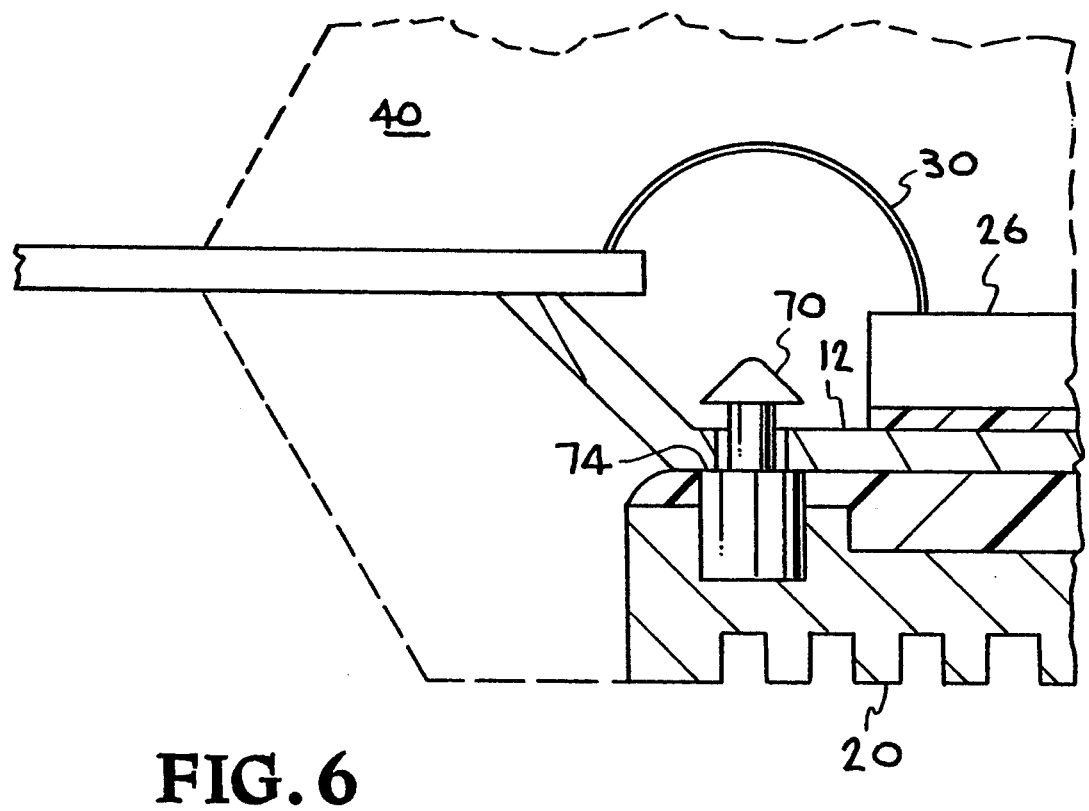
FIG. 6 is an enlarged view of a portion of a package assembly, similar to the package assembly of FIG. 3, where a locating stud is provided with a shoulder to standoff a heat sink from a die-attach paddle.

FIG. 6 is an enlarged view of a portion of a package assembly showing a locating stud 70 of FIG. 5E with the shoulder 74 serving to space-apart, or standoff, the heat sink 20 a specific distance from the die-attach paddle 12, as indicated in the Figure.

Standard MQFP lead frames are used with certain modifications, where the modifications can be used both with and without the heat sinks. A heat sink is locked in place by the enlarged heads at the distal end of the locating studs. The heat sink resiliently floats in relationship to the lead frame on the thermal grease. For materials which have matching TCE's, the heat sink can be connected directly to the die paddle by swaging the ends of the locating studs using an appropriately designed locating studs and location holes.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A method for cooling an integrated-circuit die which is covered and in contact with molded-plastic material forming a molded-plastic package body, comprising the steps of:

attaching an integrated-circuit die to one side of a central die-attach paddle of a lead frame;

resiliently fixing a heat sink member to the other side of said die-attach paddle with a layer of viscous thermal grease disposed between said heat sink member and said other side of said die-attach paddle;

coarsely positioning said heat sink with respect to said other side of said die-attach paddle, wherein said step of coarsely positioning said heat sink with respect to said other side of said die-attach paddle includes the steps of:

fixing one or more studs to said heat sink; and loosely engaging said one or more studs in respective one or more holes which are formed in said lead frame;

forming a molded-plastic package body of molded-plastic material which covers and which is in contact with said integrated circuit die attached to said central die-attach paddle, wherein said molded-plastic material substantially fills the entire available inner volume of said package body so that the molded-plastic material directly contacts the integrated circuit die with substantially no voids within the inner volume of said package body.

2. The method of claim 1 wherein said step of loosely engaging said one or more studs in respective one or more holes which are formed in said lead frame includes loosely engaging one or more holes formed in said central die-attach paddle portion of said lead frame.

3. The method of claim 2 wherein said step of loosely engaging said one or more studs in respective one or more holes which are formed in said lead frame includes loosely engaging one or more holes formed in the tie bar portion of said lead frame.

4. The method of claim 1 including the step of clipping said lead frame to said studs by loosely engaging said one or more studs with respective holes in said lead frame.

5. The method of claim 1 including the step of spacing said heat sink member a distance away from said other side of said die-attach paddle using a shoulder portion of said stud which loosely engages said lead frame to prevent said stud from further passing through said hole in said lead frame.

* * * * *